(12) United States Patent
Kaplinsky

(10) Patent No.: US 6,211,804 B1
(45) Date of Patent: Apr. 3, 2001

(54) USING SINGLE LOOKUP TABLE TO CORRECT DIFFERENTIAL NON-LINEARITY ERRORS IN AN ARRAY OF A/D CONVERTERS

(75) Inventor: Michael Kaplinsky, Monrovia, CA (US)

(73) Assignee: Photobit Corporation, Pasadena, CA (US)

(*) Notice: Subject to any disclaimer, the term of this patent is extended or adjusted under 35 U.S.C. 154(b) by 0 days.

(21) Appl. No.: 09/304,526

(22) Filed: May 4, 1999

Related U.S. Application Data

(60) Provisional application No. 60/084,374, filed on May 4, 1998.

(51) Int. Cl.[7] ................................................ H03M 1/10

(52) U.S. Cl. .......................................... 341/120; 341/155

(58) Field of Search ................................... 341/106, 155, 341/94, 120

(56) References Cited

U.S. PATENT DOCUMENTS 3,903,371 * 9/1975 Colton et al. ........................... 179/15
5,600,661 * 2/1997 Shimokoriyama ................... 371/40.1

* cited by examiner

Primary Examiner—Peguy JeanPierre
(74) Attorney, Agent, or Firm—Fish & Richardson P.C.

(57) ABSTRACT

Generation of a single look-up table for performing DNL correction on an array of analog-to-digital converters (ADCS) is disclosed. Initially, the analog input voltages to the array of ADCs are generated. The input voltages ramp up in steps of some predetermined value. Then, the digital output data are collected and stored in a frame-grabber buffer. A frame of output data are examined for missed codes. The missed codes are identified and recorded. Next, an ADC with a highest number of missed codes is selected for use in generating the look-up table. Finally, the look-up table entries are filled in with consecutive integer values using the corresponding actual output of the selected ADC as an address in the look-up table. During this process, there will be some entries that are missing. These empty entries are filled in with values identical to the value following the empty entries.

14 Claims, 6 Drawing Sheets

USING SINGLE LOOKUP TABLE TO CORRECT DIFFERENTIAL NON-LINEARITY ERRORS IN AN ARRAY OF A/D CONVERTERS

CROSS-REFERENCE TO RELATED APPLICATIONS

This application claims benefit of the priority of U.S. Provisional Application Ser. No. 60/084,374, filed May 4, 1998 and entitled "Method for Missing Codes (DNL) Correction for Array of N-bit ADCs Using Single $2^N \times N$ Look-up Table."

BACKGROUND

The present specification generally relates to analog-to-digital converters (ADCs) and particularly to differential non-linearity corrections in ADCs using a look-up table.

Analog-to-digital converters (ADCs) employ a variety of different circuit techniques to implement the conversion function. One of the popular techniques used for moderate to high-speed application is the successive-approximation type ADC shown in FIG. 1.

The operation of this ADC is analogous to weighing an unknown object on a laboratory balance scale as 1, ½, ¼, ⅛, . . . 1/n standard weight units. The largest weight is placed on the balance pan first; if it does not tip, the weight is left on and the next largest weight is added. If the balance does tip, the weight is removed and the next one added. The same procedure is used for the next largest weight and so on down to the smallest. After the n-th standard weight has been tried and a decision made, the weighing is finished. The total of the standard weights remaining on the balance is the closest possible approximation to the unknown weight.

In the ADC illustrated in FIG. 1, a successive-approximation register 100 controls the digital-to-analog converter (DAC) 102 by implementing the weighing logic with successively smaller size capacitors. However, even though the capacitors are scaled relative to one another, there are often errors in the scaling. A differential non-linearity (DNL) can occur based on errors in the relationship of the sizes and capacities of the capacitors.

An array of ADCs are used in digital imaging devices, such as active pixel sensor (APS) cameras, include many sensors arranged into arrays of columns and rows. Each image sensor collects electrical charge when exposed to light. Control signals provided to the image sensors periodically enable the sensors to transfer the collected charges to the array of ADCs. The collected charges are converted to digital data and stored in the column-parallel ADC registers.

SUMMARY

The inventor noticed that by selecting an ADC with a highest number of missed codes for use in generating a look-up table, the response of the ADC can be corrected to have substantially linear response for all the ADCs in an array. Furthermore, the switching on and off of the mismatched capacitors of the successive-approximation ADC causes the missing codes to occur at multiples of power of two. Therefore, the DNL corrections are needed at the same code values for all ADCs in the array. The difference among the DNL behaviors of all ADCs includes the magnitudes of the required DNL corrections.

In one aspect, the present disclosure involves generation of a single look-up table for performing DNL correction on an array of ADCs. Initially, the analog input voltages to the array of ADCs are generated. The input voltages ramp up in steps of some predetermined value. Then, the digital output data are collected and stored in a frame-grabber buffer. A frame of output data are examined for missed codes. The missed codes are identified and recorded. Next, an ADC with a highest number of missed codes is selected for use in generating the look-up table.

The look-up table entries are filled in with consecutive integer values using the corresponding actual output of the selected ADC as an address in the look-up table. During this process, there will be some entries that are missing. These empty entries are filled in with values identical to the value following the empty entries.

In another aspect, a computer-implemented process for generating a look-up table that performs non-linearity corrections on an array of ADCs is disclosed.

In a further aspect, a digital imaging system is disclosed. The imaging system includes a pixel sensor array, a row-select element, and an ADC system. The pixel sensor array is arranged in an array of rows and columns. The sensor array is configured to form an electrical representation of an image being sensed.

The row-select element selects a row of pixel sensors to convert. Finally, the ADC system converts electrical charges sensed by the row of pixel sensors to digital pixel data.

The ADC system includes a look-up table and an array of ADCs. The look-up table has an address for each step value of the code and a corresponding entry for the address. The array of ADCs is configured to receive analog voltages from the row of pixel sensors and to convert the analog voltages to the digital pixel data. The conversion is performed by referencing the ADC output to the address in the look-up table and placing the corresponding entry as the digital pixel data on a bus output port.

In some embodiments, the digital imaging system also includes an image display device that is connected to the ADC system. The display device has a display screen and is configured to transfer digital pixel data from the bus output port. The display device arranges the pixel data in sequential order of rows to display the visual image on the display screen.

The details of one or more embodiments are set forth in the accompanying drawings and the description below. Other embodiments and advantages will become apparent from the following description and drawings, and from the claims.

BRIEF DESCRIPTION OF THE DRAWINGS

These and other aspects will be described in reference to the accompanying drawings wherein.

Like reference numbers and designations in the various drawings indicate like elements.

DETAILED DESCRIPTION

Figure 1:
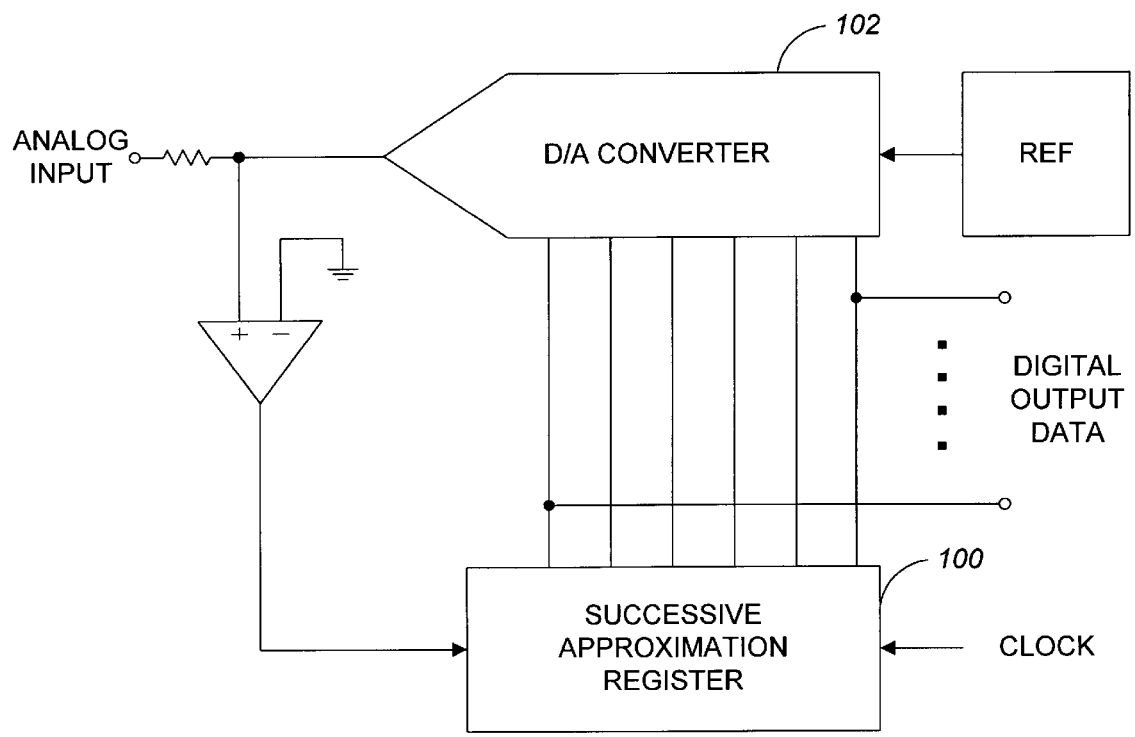
FIG. 1 is a prior art successive-approximation type ADC.
Figure 2:
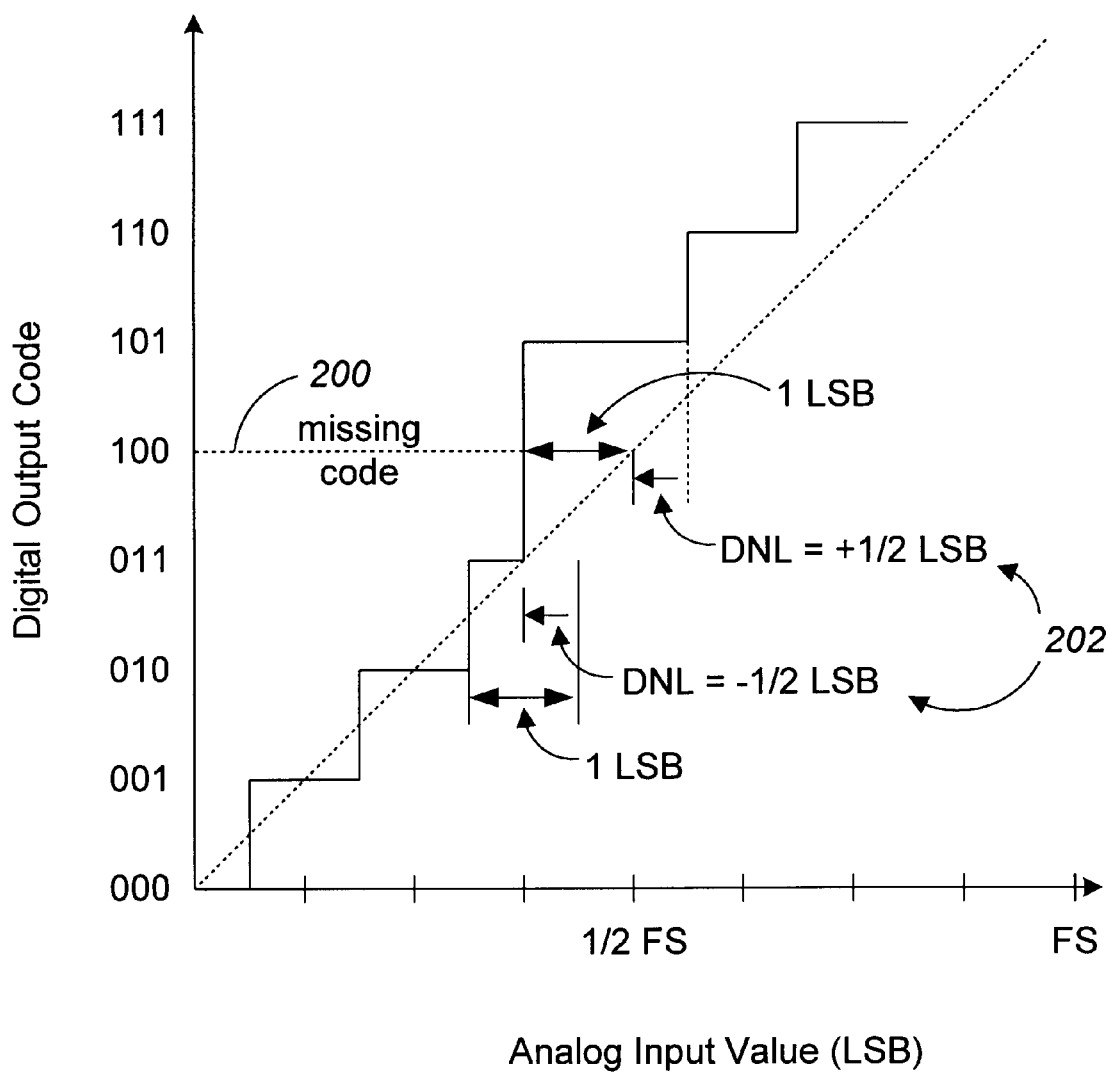
FIG. 2 illustrates the DNL errors that cause certain codes in the digital output of the ADC to be missing.

FIG. 2 illustrates the DNL errors 202 that cause certain codes 200 in the digital output of the ADC to be missing.

This effectively reduces the dynamic range of the ADC, causes granularity problems, and also may be perceived as noise. Therefore, it is desirable to correct the DNL errors 202.

The present disclosure involves generation of a single look-up table for performing DNL correction on an array of ADCs. The generation of the single look-up table for all ADCs is based on the observation that the missing codes occur at multiples of power of two. The switching on and off of the mismatched capacitors of the successive-approximation ADC causes the missing codes to occur at multiples of power of two. Therefore, the DNL corrections are needed at the same code values for all ADCs in the array. The only difference among the DNL behaviors of all ADCs is the magnitudes of the required DNL corrections.

The DNL corrections performed using the look-up table yield substantially linear response for all ADCs. Hence, the generated look-up table for an ADC with the worst case DNL error (i.e. largest number of missing codes) can eliminate the missing codes for all other ADCs in the array.

The worst DNL errors occur at the major code transitions, such as at ¼ and ½ of the full-scale range (FSR). The difficulty at the major transition points is that, for example, the most significant bit (MSB) current source capacitor is turning on while all other capacitors are turning off. This subtraction of currents must be accurate to within ±½ least significant bit (LSB) and may be a severe constraint in a high resolution DAC. The most difficult transition is at ±½ FSR, where all bits change state (e.g. for an 8-bit ADC, 01111111 to 10000000). The worst DNL error generally occurs here. The next most difficult transition occurs at ¼ FSR, where all but one of the bits change state (e.g. 00111111 to 01000000).

Figure 3:
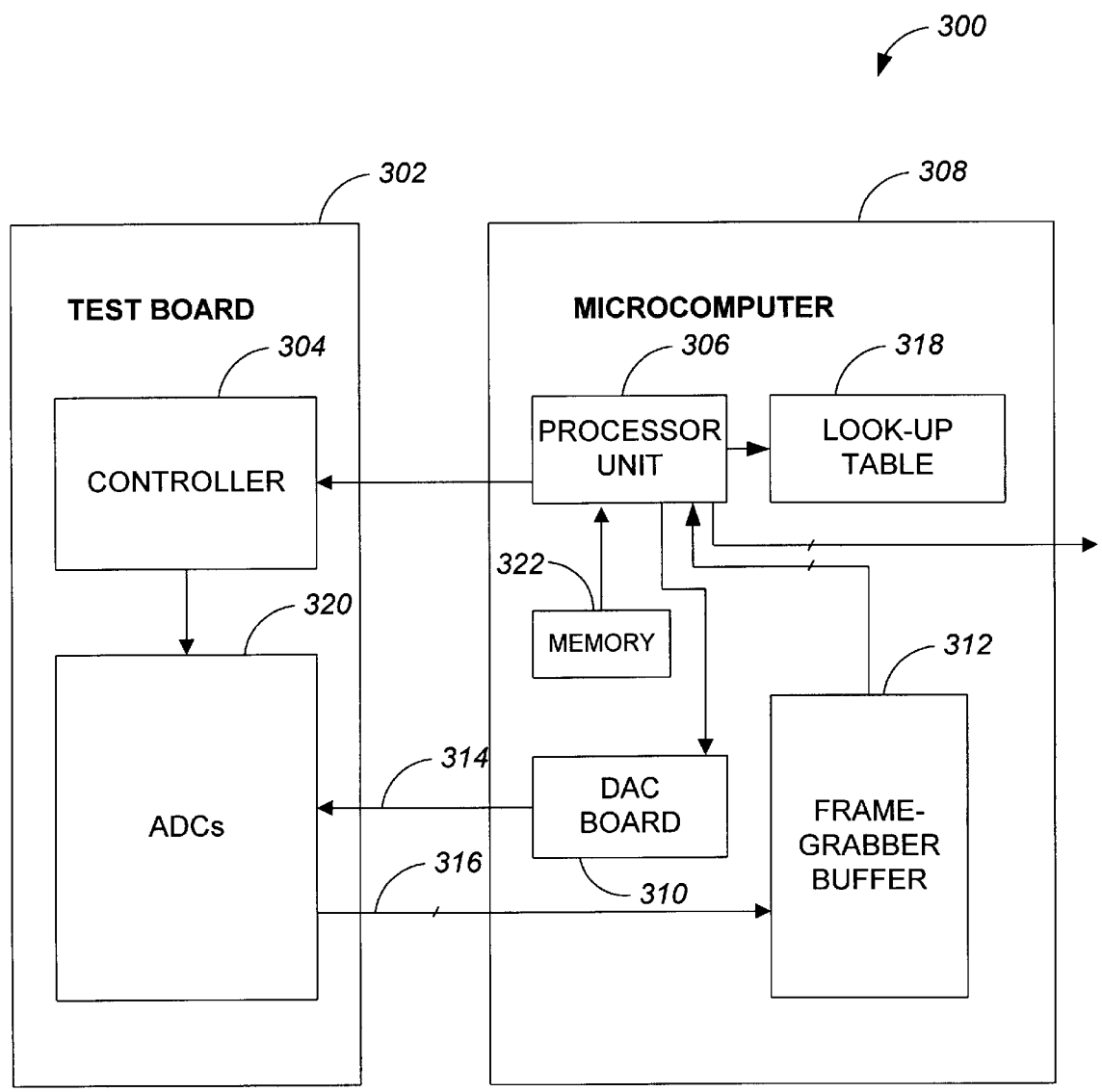
FIG. 3 is one implementation of a test setup to build a DNL correction look-up table.

FIG. 3 shows one implementation of a test setup 300 to build a DNL correction look-up table 318 and characterize the operation of the ADCs 320. During the test, the test board 302 is controlled by a controller 304. The controller 304 is sequenced by a control software residing in a memory 322. The software is loaded into a processor unit 306 in a microcomputer 308 during power up.

The ADC input voltage 314 is provided by a DAC board 310 in the microcomputer 308. The DAC board 310 is commanded by the processor unit 306 to output ramp-up voltages in steps of ⅓ of the current LSB value. After each voltage setting is allowed to stabilize for approximately one second, the outputs of all ADCs 316 are acquired in a frame-grabber buffer 312.

A missing ADC code is defined whenever there is more than one LSB change of the ADC at a time during the ramp-up of the input voltage. The test is conducted for a number of ADC reference voltages ranging from 1.0 volts to 2.6 volts.

At the beginning of each test, the voltage value of the LSB corresponding to the given reference voltage is determined. The LSB value is determined by sweeping through the voltage range from zero volts to the ADC reference voltage and dividing the voltage range value by the total number of steps. Once the current LSB value has been determined, a gradual ramp-up of input voltage is initiated with a step equal to ⅓ of the LSB.

Figure 4:
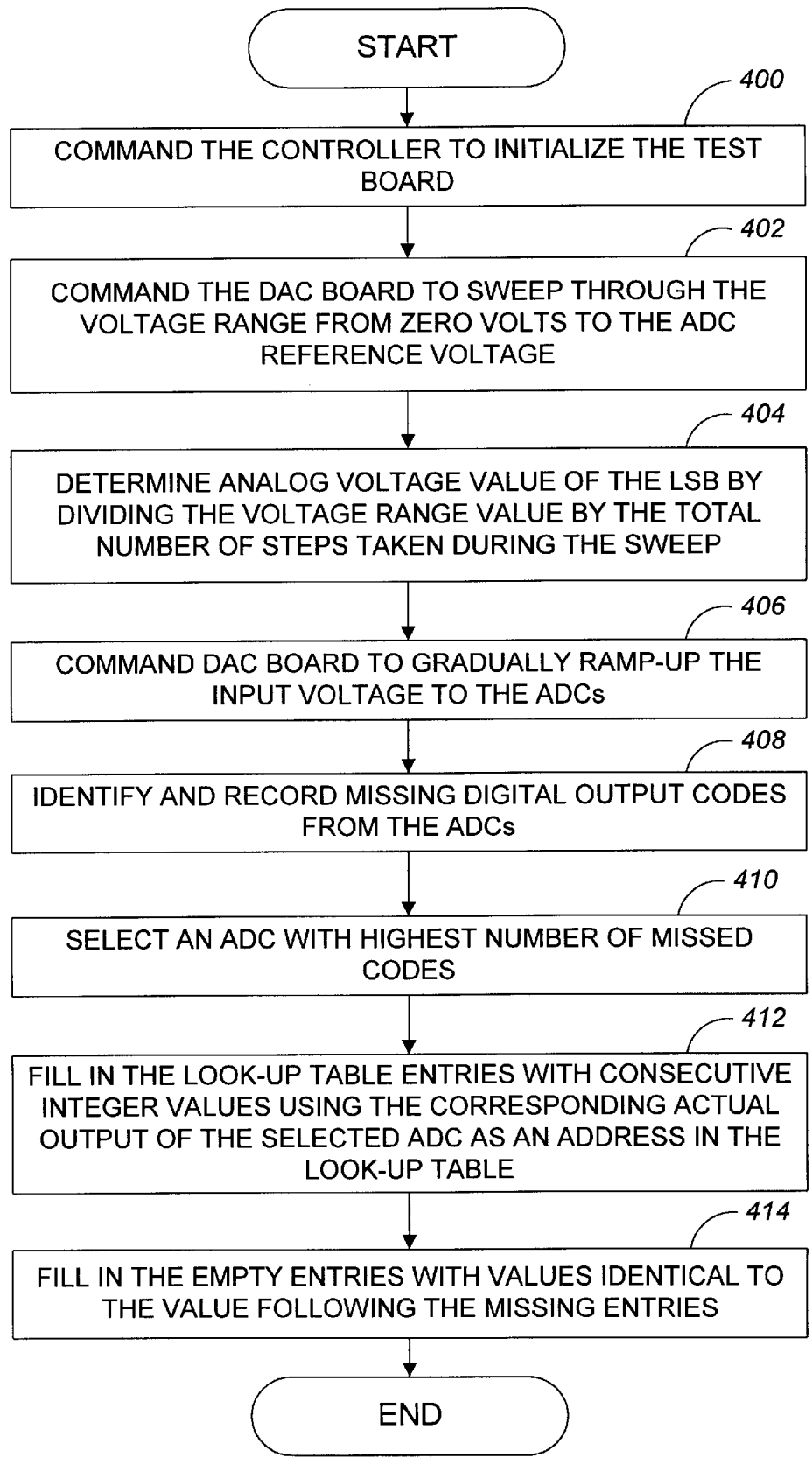
FIG. 4 is a process flow diagram of the control software used in the test setup that generates a look-up table.

FIG. 4 shows a process flow diagram of the control software used in the test setup 300 described above in generating the look-up table 318.

The process involves two main tasks. The first task involves commanding the controller 304 to initialize the test board 302 at step 400. The software commands DAC board 310 to sweep through the voltage range from zero volts to the ADC reference voltage at step 402. The analog voltage value of the LSB is then determined by dividing the voltage range value by the total number of steps taken during the sweep of the voltage range at step 404. Once the LSB value is determined, the control software commands the DAC board 310 to gradually ramp-up the input voltage at ⅓ of the LSB value at step 406.

Next, the missing digital output codes of all ADCs are identified and recorded in a two dimensional array at step 408. An ADC characterized by a highest number of missed codes is selected for generation of the initial look-up table at step 410. Then, the table entries are filled with consecutive integer values using the corresponding actual output of the selected ADC as an address in the look-up table at step 412. The digital output frame of the ADC is stored in the frame-grabber buffer 312. After the first step, several of the table addresses will have empty entries since some of the codes were skipped by the selected ADC. Thus, the empty entries must be specified in the next step to make the look-up table usable by the other ADCs.

The second task involves filling the empty entries in the look-up table. The missing entries are filled with values identical to the value following the missing entries at step 414. The resulting look-up table, like the one shown below, in Table 1, for a 7-bit ADC with 128 addresses, yields a monotonically increasing output response for all ADCs.

In the process described in FIG. 4, the response of the ADC with the most missing codes will be corrected to have a linear response while those with less missing codes will have somewhat slower response. The process also reduces the output range of all ADCs. However, since the magnitude of the correction is proportional to the actual ADC count, the faster advance of the ADCs with larger DNL errors will be partially compensated. This compensation results in a reduced fixed-pattern noise.

TABLE 1

Typical Look-Up Table for DNL corrections

| A* | E | A | E | A | E | A | E | A | E | A | E | A | E | A | E |
|---|---|---|---|---|---|---|---|---|---|---|---|---|---|---|---|
| 1 | 1 | 17 | 13 | 33 | 24 | 49 | 36 | 65 | 46 | 81 | 58 | 97 | 69 | 113 | 80 |
| 2 | 2 | 18 | 14 | 34 | 25 | 50 | 37 | 66 | 47 | 82 | 59 | 98 | 70 | 114 | 81 |
| 3 | 3 | 19 | 15 | 35 | 26 | 51 | 38 | 67 | 48 | 83 | 60 | 99 | 71 | 115 | 82 |
| 4 | 3 | 20 | 15 | 36 | 26 | 52 | 38 | 68 | 48 | 84 | 60 | 100 | 71 | 116 | 82 |
| 5 | 4 | 21 | 16 | 37 | 27 | 53 | 39 | 69 | 49 | 85 | 61 | 101 | 72 | 117 | 83 |
| 6 | 5 | 22 | 17 | 38 | 28 | 54 | 40 | 70 | 50 | 86 | 62 | 102 | 73 | 118 | 84 |
| 7 | 6 | 23 | 18 | 39 | 29 | 55 | 41 | 71 | 51 | 87 | 63 | 103 | 74 | 119 | 85 |
| 8 | 6 | 24 | 18 | 40 | 29 | 56 | 41 | 72 | 51 | 88 | 63 | 104 | 74 | 120 | 85 |
| 9 | 7 | 25 | 19 | 41 | 30 | 57 | 42 | 73 | 52 | 89 | 64 | 105 | 75 | 121 | 86 |

TABLE 1-continued

Typical Look-Up Table for DNL corrections

| A* | E | A | E | A | E | A | E | A | E | A | E | A | E |
|---|---|---|---|---|---|---|---|---|---|---|---|---|---|
| 10 | 8 | 26 | 20 | 42 | 31 | 58 | 43 | 74 | 53 | 90 | 65 | 106 | 76 | 122 | 87 |
| 11 | 9 | 27 | 21 | 43 | 32 | 59 | 44 | 75 | 54 | 91 | 66 | 107 | 77 | 123 | 88 |
| 12 | 9 | 28 | 21 | 44 | 32 | 60 | 44 | 76 | 54 | 92 | 66 | 108 | 77 | 124 | 88 |
| 13 | 10 | 29 | 22 | 45 | 33 | 61 | 45 | 77 | 55 | 93 | 67 | 109 | 78 | 125 | 88 |
| 14 | 11 | 30 | 23 | 46 | 34 | 62 | 45 | 78 | 56 | 94 | 68 | 110 | 79 | 126 | 88 |
| 15 | 12 | 31 | 23 | 47 | 35 | 63 | 45 | 79 | 57 | 95 | 68 | 111 | 79 | 127 | 88 |
| 16 | 12 | 32 | 23 | 48 | 35 | 64 | 45 | 80 | 57 | 96 | 68 | 112 | 79 | 128 | 88 |

*A = address
E = entry

Figure 5:
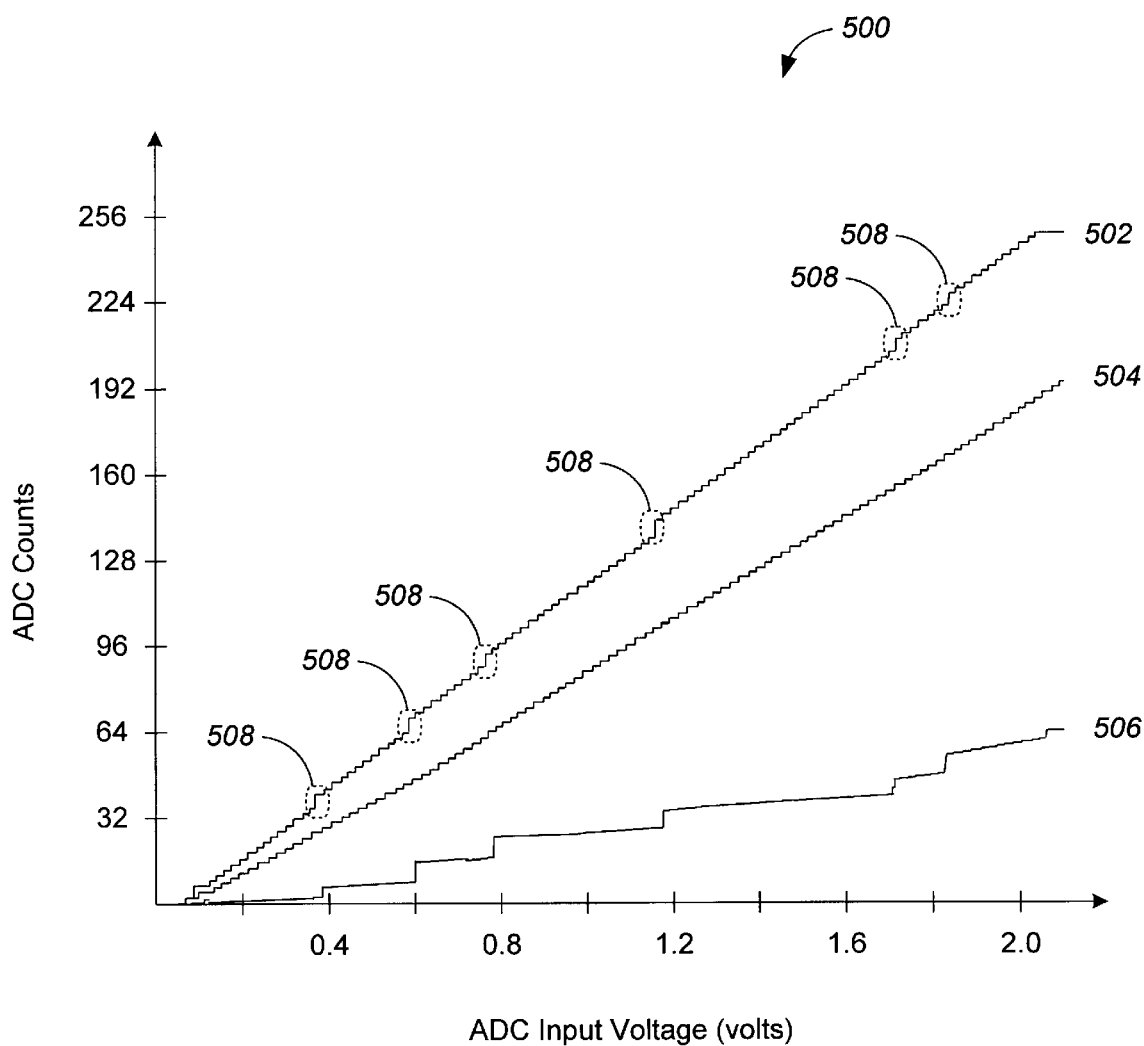
FIG. 5 is a typical ADC response of one of the 8-bit ADCS.

FIG. 5 illustrates the typical ADC response of one of the 8-bit ADCs in the array. The FIG. 500 shows plots of the raw ADC output 502 and the DNL corrected ADC output 504 using the look-up table 318. The FIG. 500 also shows a plot of the DNL corrections 506.

The missed codes 508 due to the DNL errors are shown on the raw ADC output plot 502. The DNL errors have the cumulative effect on ADC response with response curve deviating upward from the expected monotonically increasing line. The reference voltage for this test was set at 2.1 volts, and the DNL errors caused approximately 70 missed codes.

Generally, the total number of missed codes range between 40 and 120 depending on the reference voltage. The lower the reference voltage, the higher the number of missed codes. Therefore, the missed codes result in reduction of the effective dynamic range between 0.5 and 1.0 LSB.

Figure 6:
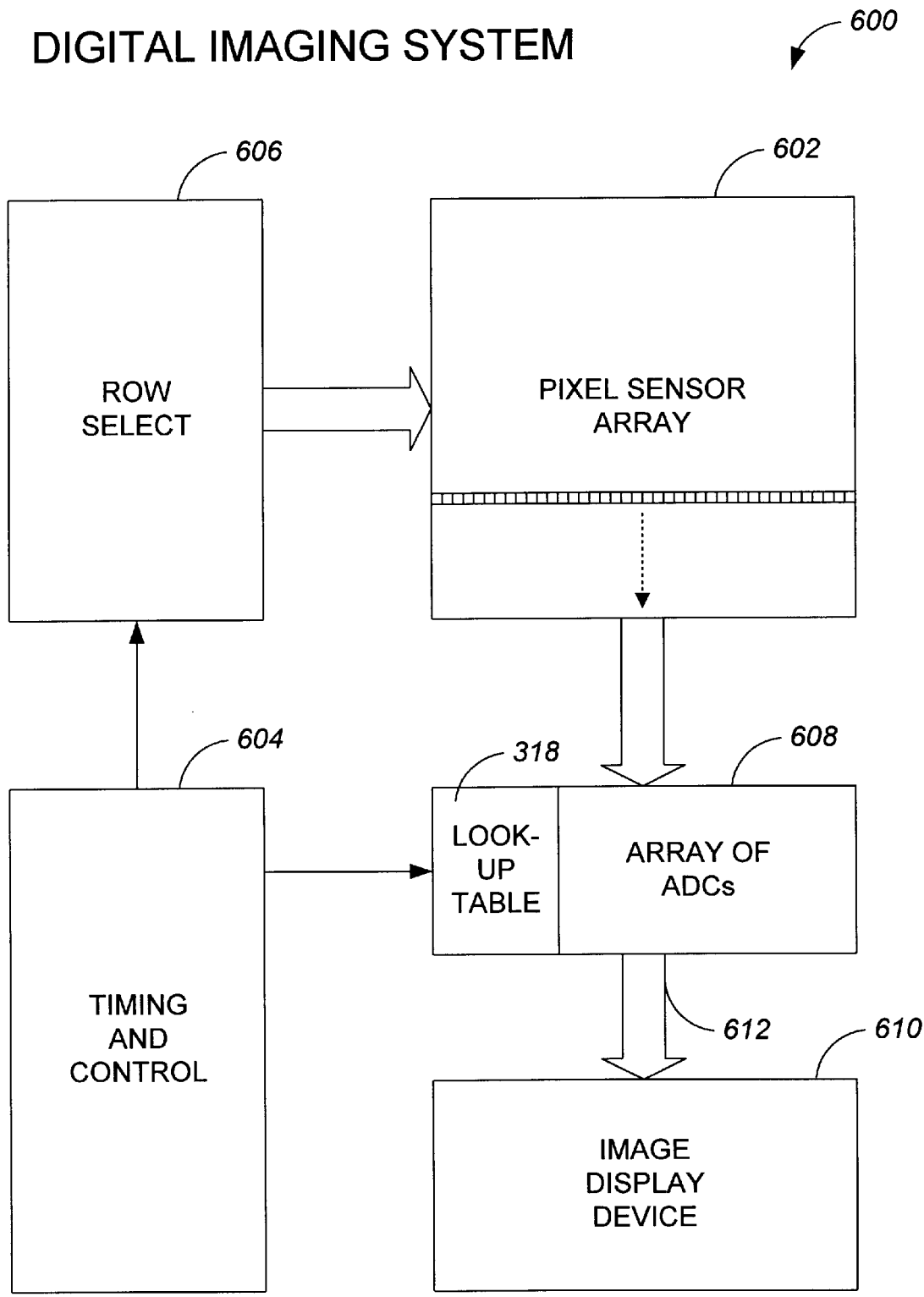
FIG. 6 is a digital imaging device using an array of ADCs with a built-in look-up table for DNL corrections.

FIG. 6 shows a digital imaging system, such as an active pixel sensor (APS) or a charge-coupled device (CCD) camera system, using an array of ADCs 608 with a built-in look-up table 318 for DNL corrections. The imaging system 600 includes a pixel sensor array 602, a timing and control unit 604, a row-select element 606, an array of ADCs 608, including a look-up table 318, and an image display device 610.

The timing and control unit 604 commands the row-select element 606 to select a row of the pixel sensor array 602. The array of ADCs 608 converts electrical charge sensed by the row of pixel sensor array 602 to digital pixel data using the look-up table 318. In converting the electrical charges represented as analog voltages to digital data, ADCs use the initial digital output as an address in the look-up table. An entry value corresponding to the referenced address is used instead as a digital pixel data. Thus, the transfer functions of the ADCs are optimized by the look-up table 318. Finally, the table- referenced digital pixel data are then channeled to the image display device 610 through the bus output port 612 for viewing. The display device 610 arranges the pixel data in sequential order of rows to display the visual image on a display screen.

Although only a few embodiments have been described in detail above, those of ordinary skill in the art certainly understand that modifications are possible. For example, some versions of the control software used in the test setup can be implemented in digital discrete components, in application specific integrated circuits (ASICs), in computer programs executed by programmable processors, or in some combination of these technologies. In addition, the look-up table can be maintain in a non-volatile memory device or in a separate programmable memory device that is capable of being commanded to load the table into a random-access memory during power-up. All such modifications are intended to be encompassed within the following claims, in which:

What is claimed is:

1. A computer system for generating a look-up table that performs non-linearity corrections on analog-to-digital converters, the computer system comprising:

an analog voltage generator configured to generate and supply varying analog voltages to the analog-to-digital converters; and a processor configured to generate control and command signals, and to collect a frame of digital output data from each of the analog-to-digital converter, the frames used by the processor to count the missed codes in the frames and to select an analog-to-digital converter with a highest number of missed codes, such that the processor generates the look-up table based on the selected analog-to-digital converter.

2. The system of claim 1, further comprising:

a memory coupled to the processor and including control software, the memory configured to load the control software into the processor, where the processor generates command and control signals according to the control software.

3. The system of claim 1, further comprising:

a frame-grabber buffer coupled to the processor and the analog-to-digital converters, and configured to collect a frame of digital output data from each of the analog-to-digital converters.

4. The system of claim 1, wherein the analog voltages are supplied in steps of a particular amount that ramps up.

5. The system of claim 1, wherein the computer system is an application-specific system configured to generate look-up tables for different types of analog-to-digital converters.

6. The system of claim 1, wherein the look-up table is stored in a non-volatile memory.

7. The system of claim 1, wherein the look-up table is stored in a particular amount of memory space on a computer readable medium.

8. A method of generating a look-up table that performs non-linearity corrections on an array of analog-to-digital converters, the method comprising:

generating and supplying input voltages to the array of analog-to-digital converters;

identifying and recording missed digital output codes from the analog-to-digital converters;

selecting an analog-to-digital converter with a highest number of missed codes;

filling in look-up table entries with consecutive integer values using the corresponding actual output of the selected analog-to-digital converter as an address in the look-up table; and filling in empty entries in the look-up table with values identical to the value following the empty entries.

9. The method of claim 8, further comprising:

determining the input voltages by dividing the reference voltage range by the total number of steps to be taken and supplying the input voltages that ramp up in steps.

10. The method of claim 8, further comprising:

storing the generated look-up table in a memory device.

11. The method of claim 8, wherein the selection of the analog-to-digital converter with the highest number of missed codes is performed by a processor analyzing frames of digital data from the analog-to-digital converters.

12. A system for generating a look-up table that performs non-linearity corrections on analog-to-digital converters, the system comprising:

an analog voltage generator configured to generate and supply input voltages for the analog-to-digital converters; and a processor configured to select an analog-to-digital converter with a highest number of missed codes, the missed codes of each of the analog-to-digital converters computed from digital output data generated by the analog-to-digital converters, such that the processor generates the look-up table based on the selected analog-to-digital converter.

13. A computer-implemented process for generating a look-up table that performs non-linearity corrections on an array of analog-to-digital converters, the process comprising:

generating and supplying input voltages to the array of analog-to-digital converters;

identifying and recording missed digital output codes from the analog-to-digital converters;

selecting an analog-to-digital converter with a highest number of missed codes;

filling in look-up table entries with consecutive integer values using the corresponding actual output of the selected analog-to-digital converter as an address in the look-up table; and filling in empty entries in the look-up table with values identical to the value following the empty entries.

14. A computer program, residing on a computer-readable medium, for generating a look-up table that performs non-linearity corrections on an array of analog-to-digital converters, the program comprising executable instructions that enable the computer to:

generate and supply input voltages to the array of analog-to-digital converters;

identify and record missed digital output codes from the analog-to-digital converters;

select an analog-to-digital converter with a highest number of missed codes;

fill in look-up table entries with consecutive integer values using the corresponding actual output of the selected analog-to-digital converter as an address in the look-up table; and fill in empty entries in the look-up table with values identical to the value following the empty entries.

* * * * *